United States Patent [19]

Akiyama

[11] Patent Number: 4,479,257
[45] Date of Patent: Oct. 23, 1984

[54] SUPERHETERODYNE CIRCUIT HAVING VARIABLE BANDWIDTH AND CENTER FREQUENCY SHIFT FUNCTION

[75] Inventor: Koji Akiyama, Tokyo, Japan
[73] Assignee: Yaesu Musen Co., Ltd., Tokyo, Japan
[21] Appl. No.: 454,652
[22] Filed: Dec. 30, 1982
[51] Int. Cl.$^3$ .............................................. H04B 1/26
[52] U.S. Cl. .................................... 455/266; 455/316
[58] Field of Search ............................... 455/314–316, 455/183, 203, 189, 266

[56] References Cited

U.S. PATENT DOCUMENTS

| | | | |
|---|---|---|---|
| 2,998,517 | 8/1961 | Beckerich | 455/315 |
| 3,008,043 | 11/1961 | Caulk | 455/316 |
| 3,372,339 | 3/1968 | Harrison et al. | 455/314 |
| 4,152,669 | 5/1979 | Igarashi | 455/316 |
| 4,198,604 | 4/1980 | Holdaway | 455/316 |
| 4,211,975 | 7/1980 | Kuroda | 455/316 |
| 4,259,644 | 3/1981 | Iimura | 455/316 |
| 4,262,361 | 4/1981 | Hauer | 455/266 |
| 4,267,605 | 2/1979 | Matsuzawa et al. | 455/315 |

FOREIGN PATENT DOCUMENTS 0047310  4/1977  Japan ..................... 455/316

Primary Examiner—Marc E. Bookbinder
Attorney, Agent, or Firm—Armstrong, Nikaido, Marmelstein & Kubovcik

[57] ABSTRACT

The invention relates to a superheterodyne circuit characterized by comprising a first mixer converting a received signal into the first intermediate frequency, a second mixer converting the first intermediate frequency into a second intermediate frequency, and a product detection stage demodulating the second intermediate frequency to an audio frequency, by having a constitution wherein the local oscillation of the first mixer is input from a VCO for which a PLL circuit is used, wherein the local oscillation of the second mixer is an output obtained by mixing the frequency of a second oscillator with that of a third oscillator in a fourth mixer, wherein the second oscillator combined with the frequency of the VFO in the sixth mixer, alone or in further combination with the frequency of the output of a BFO input via to the product detection stage is the frequency of the third oscillator or an output obtained by mixing the frequency of the third oscillator with a frequency obtained through the frequency division or multiplication of the frequency of the first oscillator in a fifth mixer, and wherein the output of the second oscillator is input to the fourth mixer and, at the same time, a frequency obtained by mixing said output with the output from a VFO in a sixth mixer is directly input to a third mixer of the PLL circuit, or an output obtained by mixing said frequency with the frequency of the first oscillator or with a frequency obtained through the multiplication or frequency division of the frequency of the first oscillator in a seventh mixer is input to said third mixer, and by conducting a variation of the total bandwidth of an intermediate-frequency stage and a shift of the center frequency by setting a reception band determined by the relationship between the set frequency-division ratio of a programmable frequency divider in the PLL circuit and the frequency of the first oscillator input a seventh mixer or a frequency obtained through the multiplication or frequency division of said frequency, by tuning a received frequency determined by the frequency of the VFO, and by varying the frequency of the second or third oscillator or by simultaneously varying the frequencies of the second and third oscillators.

5 Claims, 4 Drawing Figures

SUPERHETERODYNE CIRCUIT HAVING VARIABLE BANDWIDTH AND CENTER FREQUENCY SHIFT FUNCTION

BACKGROUND OF THE INVENTION

1. Field of the Invention

The present invention relates to a circuit having the functions of continuously varying a bandwidth, and shifting the center frequency at an intermediate-frequency stage, in a double superheterodyne circuit demodulating a received signal after converting its frequency twice.

2. Description of the Prior Art

In conventional double superheterodyne circuits, a circuit having the function of varying the bandwidth in an intermediate-frequency stage mixes a received signal $F_1$ with an oscillation frequency $F_{OSC}$ from a first local oscillator (variable) in a mixer $M_1$ as shown in FIG. 1.

A frequency $F_2$ obtained by the mixture and conversion passes through a filter $F_1$ and is mixed with an oscillation frequency $F_W$ from an oscillator $O_2$ in a mixer $M_2$, and a frequency $F_3$ thus obtained is supplied to a filter $F_2$. By varying the oscillation frequency $F_W$ of the oscillator $O_2$, the output frequency $F_3$ of the mixer $M_2$ varies according to the equation:

$$F_3 = F_W - F_2,$$

between the upper and lower sides of the pass band of the filter $F_2$. The frequency $F_3$ passing through the filter $F_2$ is mixed with the oscillation frequency $F_W$ from the oscillator $O_2$ in a mixer $M_3$ and thus returns to the original frequency $F_2$.

The frequency $F_2$ is mixed with a carrier frequency $F_C$ from an oscillator $O_3$ at a detection stage D, and thereby an audio output is transmitted. That is, the composite band of the filters $F_1$, and $F_2$ is made to vary without varying the received frequency $F_1$.

In this circuit the bandwidth does not vary much, since it has merely the constitution wherein the filter $F_1$ is fixed and the oscillation frequency $F_W$ from the oscillator $O_2$ is supplied to the mixers $M_2$ and $M_3$ provided on the input and output sides of the filter $F_2$, respectively.

In addition, this circuit also has a fault in that a continuous variation of the bandwidth, and a shift of the central frequency, can not be conducted sufficiently.

SUMMARY OF THE INVENTION

The present invention has been designed to overcome the above imperfections, aiming to furnish a circuit having the functions of continuously varying a bandwidth, and shifting the center frequency at an intermediate-frequency stage, and a method therefor, in a double superheterodyne circuit demodulating a received signal after converting its frequency twice.

We believe that the advantages of the present invention will be made clear if the specification and claims are read together with the drawings therefor.

PREFERRED EMBODIMENTS OF THE INVENTION AND DETAILED DESCRIPTION THEREOF

Figure 1:
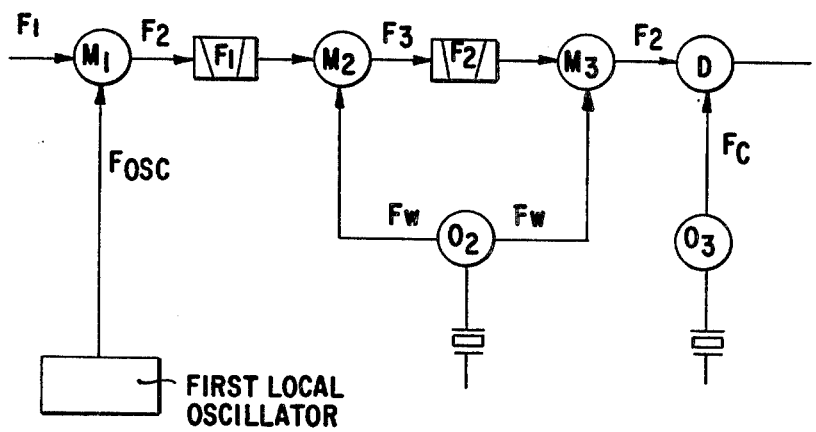
FIG. 1 is a diagram of a conventional double superheterodyne circuit having the function of varying its bandwidth at an intermediate-frequency stage.
Figure 2:
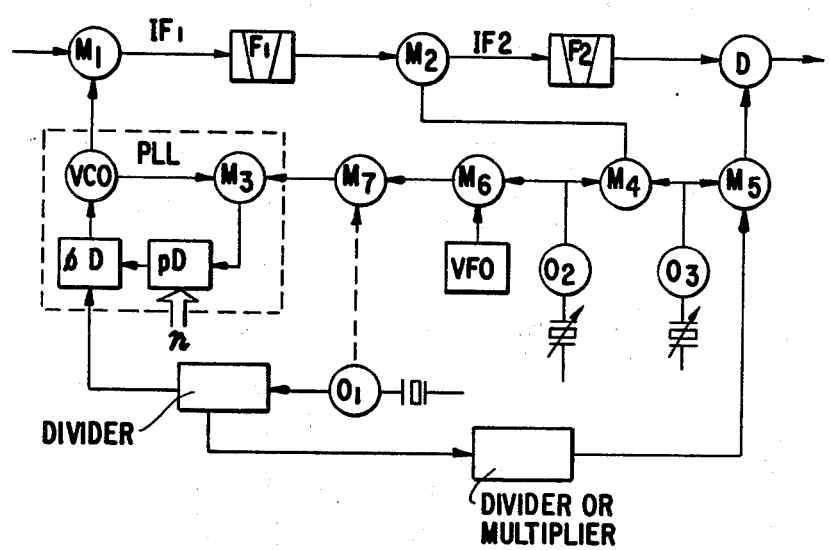
FIG. 2 is a block diagram explaining the present invention.
Figure 3:
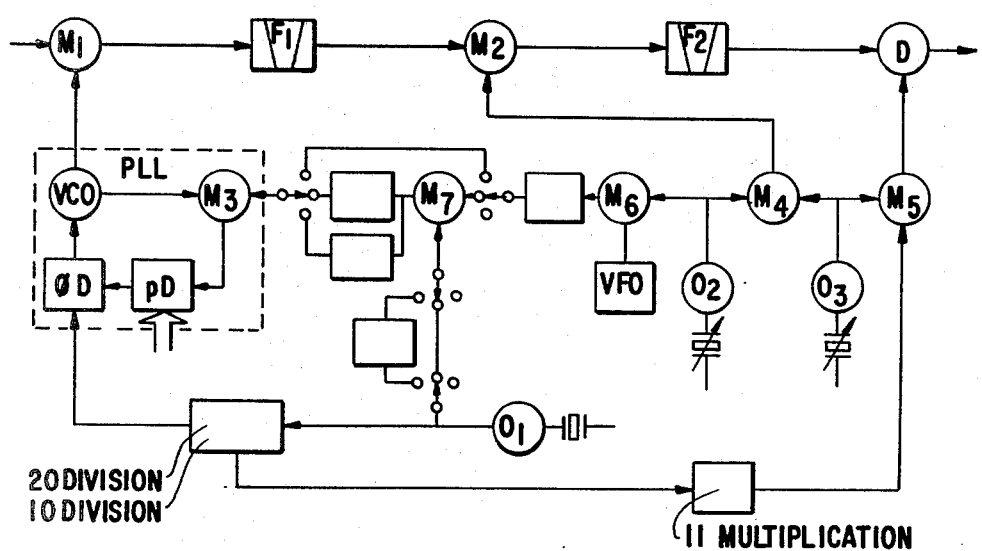
FIG. 3 is a block diagram explaining the present invention applied to an HF-band ham radio receiver.

FIG. 2 is a block diagram of a circuit showing the constitution of the present invention. In FIGS. 2 and 3, the same components as those in FIG. 1 bear the same reference symbols.

A received signal is converted into a first intermediate frequency $IF_1$ by the first mixer $M_1$ either directly or through a high-frequency amplification stage. Then, as it passes through the filter $F_1$, it is further converted into a second intermediate frequency $IF_2$ by the second mixer $M_2$ and, after passing through the filter $F_2$, it is demodulated by a product detector D. Since AM and FM signals have few problems in connection with band amplifiers or frequency shifts, the following explanation will concern product detection for SSB and CW which require the insertion of a BFO for their demodulation, and demand a constantly fixed mutual relation ship between the frequency of the BFO and the carrier frequency of the signal.

The local oscillation for the first mixer is input from a VCO (voltage-controlled oscillator) stabilized by a PLL (phase locked loop), while the oscillation frequency of this VCO is determined by a PLL system which gives VCO a control voltage whereby the output of the VCO is delivered from a phase comparator $\phi D$ through the third mixer $M_3$ and a programmable frequency divider PD, and the reference frequency of the PLL is determined by the frequency of the first oscillator $O_1$ (reference frequency oscillator) whose frequency is very stable, either directly or via a frequency division or multiplication so that it becomes the frequency required for the circuit constitution. The local oscillation of the second mixer is an output obtained by mixing the frequency of the second oscillator $O_2$ with that of the third oscillator $O_3$, in a fourth mixer $M_4$. VXOs (variable-frequency quartz oscillators) are usually employed as the oscillators $O_2$ and $O_3$, since it is necessary that their oscillation frequencies can be shifted by about 2–3 kHz and that they have an excellent frequency stability.

The oscillator $O_3$ also operates as a BFO for the product detector D. When the frequency of the BF0 is below 5 MHz, however, it sometimes happens that the required variation range can not be taken up by the VXO. In this case, the frequency of the oscillator $O_3$ is made to be at least 5 MHz, and it is mixed with the frequency obtained through a frequency division or multiplication of the frequency of the reference frequency oscillator $O_1$ by a fifth mixer $M_5$ and is supplied to the product detector D. When the output frequency of the VCO is to have wide range, however, it can not be met by the output frequency of the mixer $M_6$ alone. Therefore, the output of the mixer $M_6$ is further mixed with the output of the reference frequency oscillator $O_1$, or with a frequency obtained by the multiplication or frequency division by a mixer $M_7$, so as to have a suitable frequency range and is input to the mixer $M_3$. The operation of this circuit is explained below in connection with an HF-band ham radio receiver.

In FIG. 3, the first intermediate frequency is intended to by 8 MHz (fractions are omitted for convenience in the explanation of the operation, although they are used in practice prevent interference of harmonic components) and the second intermediate frequency 455 MHz. Although the ham radio frequencies vary in width, the receivers thereof are generally set to have 500 KHz to a band containing each of the ham radio frequency bands.

In a Pll circuit containing a VCO it is convenient that the frequency varies by 500 KHz every time the program number n of the frequency divider PD changes by one. Therefore, the reference frequency of the phase comparator $\phi D$ is 500 kHz, and the frequency obtained through the frequency division is twenty times the frequency of a 10 MHz reference frequency oscillator $O_1$. For the VFO employed for tuning the frequencies in each band, a well-known one having a frequency of 5–5.5 MHz is used. The oscillators $O_2$ and $O_3$ serving as VXOs should have frequencies in ranges which are as easy to produce as possible in view of the fact that the output of the mixer $M_4$ is set at 8.455 MHz, so frequencies of 19 MHz and 10.545 MHz are selected for the oscillators $O_2$ and $O_3$, respectively. The oscillator $O_3$ is made to be a BFO of 455 kHz by mixing its frequency with the 11 MHz obtained through the multiplication by eleven of the 1 MHz output from the reference frequency oscillator $O_1$, in the mixer $M_5$.

The local oscillation frequency of the mixer $M_3$ in the PLL circuit is 13.5–14 MHz which is the difference between the 19 MHz of the oscillator $O_2$ and the 5.5–5 MHz of the VFO, and a frequency which is the difference between the above local oscillation frequency and the frequency of the VCO is input to the frequency divider PD. However, when the frequency of the VCO is high, the output frequency and the local oscillation frequency of the mixer $M_3$ approach each other, or the output frequency becomes higher than the latter, and this brings about problems concerning the removal of spurious modulations and the operation of the frequency divider. Therefore, in bands wherein the frequency is high, a mixer $M_7$ is also provided to mix the 10 MHz of the reference frequency oscillator $O_1$ and 20 MHz, twice that frequency, together.

The continuous variable-bandwidth operation will now be explained in the following.

There are two kinds of functions of variable bandwidth in the present system. The first method is implemented by varying the frequency of the oscillator $O_2$, and the positive or negative variation of the frequency of the oscillator $O_2$ induces the same amount of positive or negative variation in the first intermediate frequency $IF_1$ via the mixers $M_6$, $M_7$, $M_3$, the VCO and the mixer $M_1$. The frequency of 8.455 MHz input to the mixer $M_2$ through the mixer $M_4$ is also varied by the same positive of negative amount. Accordingly, the second intermediate frequency $IF_2$ remains the same as the original frequency.

Figure 4:
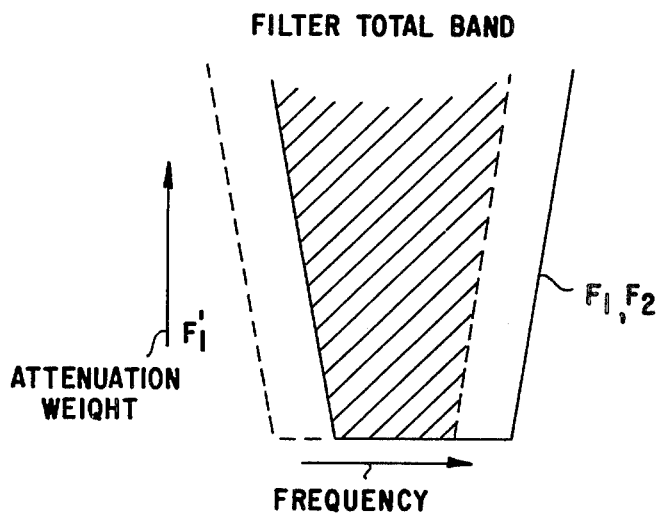
FIG. 4 is a drawing illustrating a variable bandwidth.

This means that the first intermediate frequency $IF_1$ passing through the filter $F_1$ varies by the same positive or negative amount at that of the variation of the frequency of the oscillator $O_2$. However, the first intermediate frequency is fixed relatively, and thus the above variation is equal to the negative or positive variation of the center frequency of the filter $F_1$. FIG. 4 illustrates this variation.

The filters $F_1$ and $F_2$ are preferably made to have the same bandwidth and are adjusted so that their center frequencies are regulated to be in accord with each other in relation to the signal.

When the frequency of the oscillator $O_2$ is increased by 1 kHz, for instance, the bandwidth of the filter $F_1$ is moved in the same way, as shown by $F_1'$, so that its center frequency decreases by 1 kHz, and the obliquely shaded area wherein the bandwidth of the filter $F_1$ overlaps the bandwidth of the filter $F_1'$ becomes the total pass band. Accordingly, the bandwidth narrows by amount 1 kHz in practice. In addition, by moving the frequency of the oscillator $O_2$ toward the lower side, the bandwidth can be narrowed on the opposite side.

Since the bandwidth of the filter used in a ham radio receiver is 3 kHz or less, a variable range of about ±3 kHz is sufficient for the oscillator $O_2$ and it is found that this method can be applied in practice to a VXO system having an excellent frequency stability.

The second method of making the bandwidth variable is implemented by varying the frequency of the oscillator $O_2$. When the frequency of the oscillator $O_3$ is varied positively or negatively, the frequency of the second intermediate frequency $IF_2$ is thereby varied negatively or positively via the mixers $M_4$ and $M_2$.

While the first intermediate frequency $IF_1$ does not vary, the center frequency of the second intermediate frequency $IF_2$ alone diverges from the center frequency of the filter $F_2$, and therefore, the same total effect as if the center frequency of the filter $F_2$ is transferred in the reverse direction is brought about for the same reasons as in the first method, thus the total bandwidth is narrowed by the divergence.

Since the positive or negative variation of the oscillator $O_3$ is input to the product detector D as a negative or positive variation through the mixer $M_5$, the directions of the variation of the second intermediate frequency $IF_2$ and the BFO are the same, and the amounts of the variation thereof are identical. Therefore, the relative relation ship between the received signal and the BFO is not changed and accordingly no hindrance is caused to the receiption of SSB or CW.

It is true that the center of the signal (side band) is separated by about 800 kHz from the BFO in practice for SSB, but in FIG. 3, the tendencies of the variations are explained by assuming for convenience that the second intermediate frequency $IF_2$ and the BFO have the same frequencies.

According to the above first and second methods, the band of the received signal is narrowed form both the positive and negative sides of the received signal. Furthermore, a third method may also be used. In this method, the oscillators $O_2$ and $O_3$ are varied simultaneously and the band is narrowed from the positive side of the signal toward the center in one of them, while it is narrowed from the negative side thereof toward the center in the other.

In addition, a shift of the center frequency can also be performed in this circuit.

The shift is an operation for purging the band of a filter of adjacent radio interference by transferring a received signal from the positive side to the negative side while the bandwidth is fixed generally. For AM and FM, signals such an operation is performed automatically when they are tuned, and thereby the interference is removed. For SSB, however, the demodulation is limited to the point at which a carrier and the BFO match, and therefore a special circuit constitution is needed.

The circuit offered by the present invention makes it possible to obtain exactly the same effect as if only the relative positions of the filter and the received signal are shifted while the bandwidth is not varied, by making the apparent transfer of the center frequency of the filter due to the oscillators $O_2$ and $O_3$ deviate in the same direction and by the same frequency in relation to the received signal.

Taking the frequency constitution in FIG. 3 as an example, the oscillators $O_2$ and $O_3$ are shifted by the same frequency in the same direction, the frequency input from the mixer $M_4$ to the mixer $M_2$ is fixed, while the frequency input to the mixer $M_1$ and the frequency of the BFO have opposite signs and are varied by the same amount.

The circuit constitution offered by the present invention requires a number of oscillators and mixers. However, since all the similar receivers are equipped with an oscillator $O_1$ as a reference frequency oscillator in the PLL circuit, with a VFO for tuning the receivers, and with a oscillator $O_3$ for a BFO, and considering that a oscillator $O_2$ must also be provided for the function of shifting the center frequency, the number of oscillators in the present invention is not such as to be of special mention.

The oscillators have also the effect of fulfilling a large role in preventing spurious modulations in the apparatus, since each of them is provided for a specified purpose. Two mixer units are employed in the signal circuit and four in the auxiliary circuits excluding the PLL circuit, and these can be regarded as compensation for adding a variable band and the function of shifting the center frequency of the apparatus without increasing the number of extra mixers in the signal circuit.

In FIGS. 2 and 3, only the blocks necessary for the circuit constitution have been illustrated in the simplest manner. In an actual apparatus, an amplification stage for leverling, a buffer stage, a tuning circuit for removing spurious modulations, and a filter stage will be added as required.

What is claimed is:
1. A superheterodyne circuit comprising:
a first mixer converting a received signal into a first intermediate frequency; a second mixer converting the first intermediate frequency into a second intermediate frequency; a first intermediate frequency filter connected between said first and second mixers; a product detector having a BFO input for demodulating the second intermediate frequency to an audio frequency; and a second intermediate frequency filter connected between said second mixer and said product detector, wherein a VCO supplies a local oscillation frequency to the first mixer, while the oscillation frequency of the VCO is determined by a PLL circuit, wherein the VCO is responsive to a control voltage generated by a phase comparator responsive to a reference frequency input and said supplied local oscillation frequency which is processed by a third mixer and a programmable frequency divider in cascade, a first oscillator coupled to said phase comparator to supply said reference frequency, wherein a local oscillation frequency for the second mixer is an output obtained by mixing the frequency of an adjustable frequency second oscillator with that of an adjustable frequency third oscillator in a fourth mixer; a fifth mixer responsive to a frequency of the third oscillator and a frequency related to the frequency of the first oscillator; a sixth mixer responsive to said second oscillator and a variable frequency oscillator for providing a respective output signal; a seventh mixer for mixing said respective output signal with a frequency related to the frequency of the first oscillator to provide an input signal to said third mixer of the PLL circuit; the total effective intermediate frequency bandwidth of said first and second intermediate frequency filter and an effective intermediate frequency filter center frequency position being variable for a reception band determined by the relationship between a frequency-division ratio of the programmable frequency divider of the PLL circuit and a first oscillator related frequency input to the seventh mixer, the bandwidth and center frequency position being varied by initially tuning a received frequency determined by the frequency of the VFO, and, for bandwidth variation subsequently varying the frequency of the second or third oscillator or simultaneously varying the frequencies of the second and third oscillators in a first relationship, and, for center frequency position variation, subsequently, simultaneously varying the frequencies of the second and third oscillators in a second relationship.

2. The superheterodyne circuit according to claim 1, characterized in that:
the output of the sixth mixer is altered to a convenient frequency range by mixing it further with the output from the reference frequency oscillator or with a frequency obtained through the frequency division or multiplication of said output by the seventh mixer and is input to the third mixer, since it is impossible to meet the output frequency of the VCO only by the output frequency of the sixth mixer when the output frequency of the VCO has a wide range.

3. The superheterodyne circuit according to claim 1, characterized in that:
the oscillation frequencies of the second and third oscillators can be shifted by about 2–3 kHz; and said second and third oscillators are variable-frequency quartz oscillators.

4. The superheterodyne circuit according to claim 1, characterized in that:
the frequency of the third oscillator is made to be at least 5 MHz with the frequency of the fifth mixer output being below 5 MHz.

5. The superheterodyne circuit according to claim 1, comprising:
means to bypass the seventh mixer so that said sixth mixer output signal is coupled directly to said third mixer in the PLL circuit.

* * * * *